US008399354B2

(12) United States Patent
Chen

(10) Patent No.: US 8,399,354 B2
(45) Date of Patent: Mar. 19, 2013

(54) THROUGH-SILICON VIA WITH LOW-K DIELECTRIC LINER

(75) Inventor: Ming-Fa Chen, Taichung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 453 days.

(21) Appl. No.: 12/617,259

(22) Filed: Nov. 12, 2009

(65) Prior Publication Data

US 2010/0176494 A1    Jul. 15, 2010

Related U.S. Application Data

(60) Provisional application No. 61/144,336, filed on Jan. 13, 2009.

(51) Int. Cl.
H01L 21/44 (2006.01)

(52) U.S. Cl. .......... 438/667; 257/E23.011; 257/E21.597

(58) Field of Classification Search .................. 257/774, 257/E23.011, E21.597; 438/667
See application file for complete search history.

(56) References Cited

U.S. PATENT DOCUMENTS

| 5,391,917 | A  | 2/1995  | Gilmour et al. |
| 5,510,298 | A  | 4/1996  | Redwine |
| 5,767,001 | A  | 6/1998  | Bertagnolli et al. |
| 5,880,018 | A  | 3/1999  | Boeck et al. |
| 5,998,292 | A  | 12/1999 | Black et al. |
| 6,184,060 | B1 | 2/2001  | Siniaguine |
| 6,322,903 | B1 | 11/2001 | Siniaguine et al. |
| 6,448,168 | B1 | 9/2002  | Rao et al. |
| 6,465,892 | B1 | 10/2002 | Suga |
| 6,472,293 | B1 | 10/2002 | Suga |
| 6,538,333 | B2 | 3/2003  | Kong |
| 6,599,778 | B2 | 7/2003  | Pogge et al. |
| 6,639,303 | B2 | 10/2003 | Siniaguine |
| 6,664,129 | B2 | 12/2003 | Siniaguine |
| 6,693,361 | B1 | 2/2004  | Siniaguine et al. |
| 6,740,582 | B2 | 5/2004  | Siniaguine |
| 6,800,930 | B2 | 10/2004 | Jackson et al. |
| 6,841,883 | B1 | 1/2005  | Farnworth et al. |
| 6,882,030 | B2 | 4/2005  | Siniaguine |
| 6,924,551 | B2 | 8/2005  | Rumer et al. |
| 6,962,867 | B2 | 11/2005 | Jackson et al. |
| 6,962,872 | B2 | 11/2005 | Chudzik et al. |
| 7,030,481 | B2 | 4/2006  | Chudzik et al. |
| 7,049,170 | B2 | 5/2006  | Savastiouk et al. |
| 7,060,601 | B2 | 6/2006  | Savastiouk et al. |
| 7,071,546 | B2 | 7/2006  | Fey et al. |
| 7,111,149 | B2 | 9/2006  | Eilert |
| 7,122,912 | B2 | 10/2006 | Matsui |
| 7,157,787 | B2 | 1/2007  | Kim et al. |

(Continued)

FOREIGN PATENT DOCUMENTS

| CN | 1191384 A | 8/1998 |
| CN | 1881535 A | 12/2006 |

(Continued)

Primary Examiner — Calvin Lee
Assistant Examiner — Scott Stowe
(74) Attorney, Agent, or Firm — Slater & Matsil, L.L.P.

(57) ABSTRACT

A semiconductor substrate having a through-silicon via with an air gap interposed between the through-silicon via and the semiconductor substrate is provided. An opening is formed partially through the semiconductor substrate. The opening is first lined with a first liner and then the opening is filled with a conductive material. A backside of the semiconductor substrate is thinned to expose the first liner, which is subsequently removed and a second liner formed with a low-k or extra low-k dielectric is formed in its place.

5 Claims, 4 Drawing Sheets

U.S. PATENT DOCUMENTS

| | | |
|---|---|---|
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,843,068 B2 | 11/2010 | Murayama et al. |
| 7,910,473 B2 * | 3/2011 | Chen .............................. 438/619 |
| 2001/0028105 A1 | 10/2001 | Hashimoto et al. |
| 2006/0264041 A1 * | 11/2006 | Rigg et al. .................... 438/667 |
| 2007/0045836 A1 | 3/2007 | Kwon et al. |
| 2007/0069327 A1 | 3/2007 | Tegen et al. |
| 2007/0085189 A1 * | 4/2007 | Sunohara et al. ............. 257/686 |
| 2007/0222054 A1 | 9/2007 | Hembree |
| 2008/0136038 A1 * | 6/2008 | Savastiouk et al. ........... 257/774 |
| 2008/0138975 A1 * | 6/2008 | Pratt .............................. 438/618 |
| 2009/0085164 A1 * | 4/2009 | Murayama et al. ........... 257/603 |
| 2009/0243047 A1 | 10/2009 | Wolter et al. |
| 2010/0164117 A1 | 7/2010 | Chen |
| 2010/0167534 A1 | 7/2010 | Iwata |

FOREIGN PATENT DOCUMENTS

| | | |
|---|---|---|
| JP | 2007-012854 A | 1/2007 |

* cited by examiner

THROUGH-SILICON VIA WITH LOW-K DIELECTRIC LINER

This application claims the benefit of U.S. Provisional Application Ser. No. 61/144,336, filed on Jan. 13, 2009, entitled "Through-Silicon Via With Low-K Dielectric Liner," which application is hereby incorporated herein by reference.

TECHNICAL FIELD

This invention relates generally to integrated circuits and, more particularly, to a semiconductor device having through-silicon vias.

BACKGROUND

Since the invention of the integrated circuit (IC), the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2 D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-silicon vias (TSVs). Generally, a TSV is formed by etching a vertical via through a substrate and filling the via with a conductive material, such as copper. A dielectric liner, typically tetraethyl ortho-silicate (TEOS), is formed along the sidewalls of the via prior to filling the via with the conductive material. The dielectric constant of TEOS, however, is about 4.2, thereby creating a potentially large capacitance. This large capacitance in turn may adversely affect the performance of a resistor-capacitor (RC) circuit.

Accordingly, there is a need for a better structure of and method of forming TSV structures.

SUMMARY OF THE INVENTION

These and other problems are generally reduced, solved or circumvented, and technical advantages are generally achieved, by embodiments of the present invention, which provides through-silicon vias for a semiconductor device.

In accordance with an embodiment of the present invention, a semiconductor device is provided. The semiconductor device includes a semiconductor substrate having a circuit side and a backside opposite the circuit side. A through-silicon via extends through the semiconductor substrate. A dielectric layer is interposed between the through-silicon via and the semiconductor substrate and extends over at least a portion of a surface of the backside of the semiconductor substrate.

In accordance with another embodiment of the present invention, a method of forming a semiconductor device is provided. A semiconductor substrate having a first side and a second side opposite the first side is provided. An opening is formed in the semiconductor substrate, and a first liner is formed along sidewalls of the opening. Thereafter, a conductive material is formed in the opening over the first liner. The second side of the semiconductor substrate is thinned to expose the first liner, which is then removed. After removing the first liner, a second liner is formed interposed between the semiconductor substrate and the conductive material.

In accordance with yet another embodiment of the present invention, another method of forming a semiconductor device is provided. The method includes providing a semiconductor substrate having a through-silicon via extending from a circuit side partially through the semiconductor substrate, wherein a first liner is interposed between the through-silicon via and the semiconductor substrate. A backside of the semiconductor substrate is thinned such that at least a portion of the first liner is exposed. At least a portion of the first liner interposed between the through-silicon via and the semiconductor substrate is removed, forming an opening around the through-silicon via on the backside of the semiconductor substrate. A second liner is formed in the opening.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
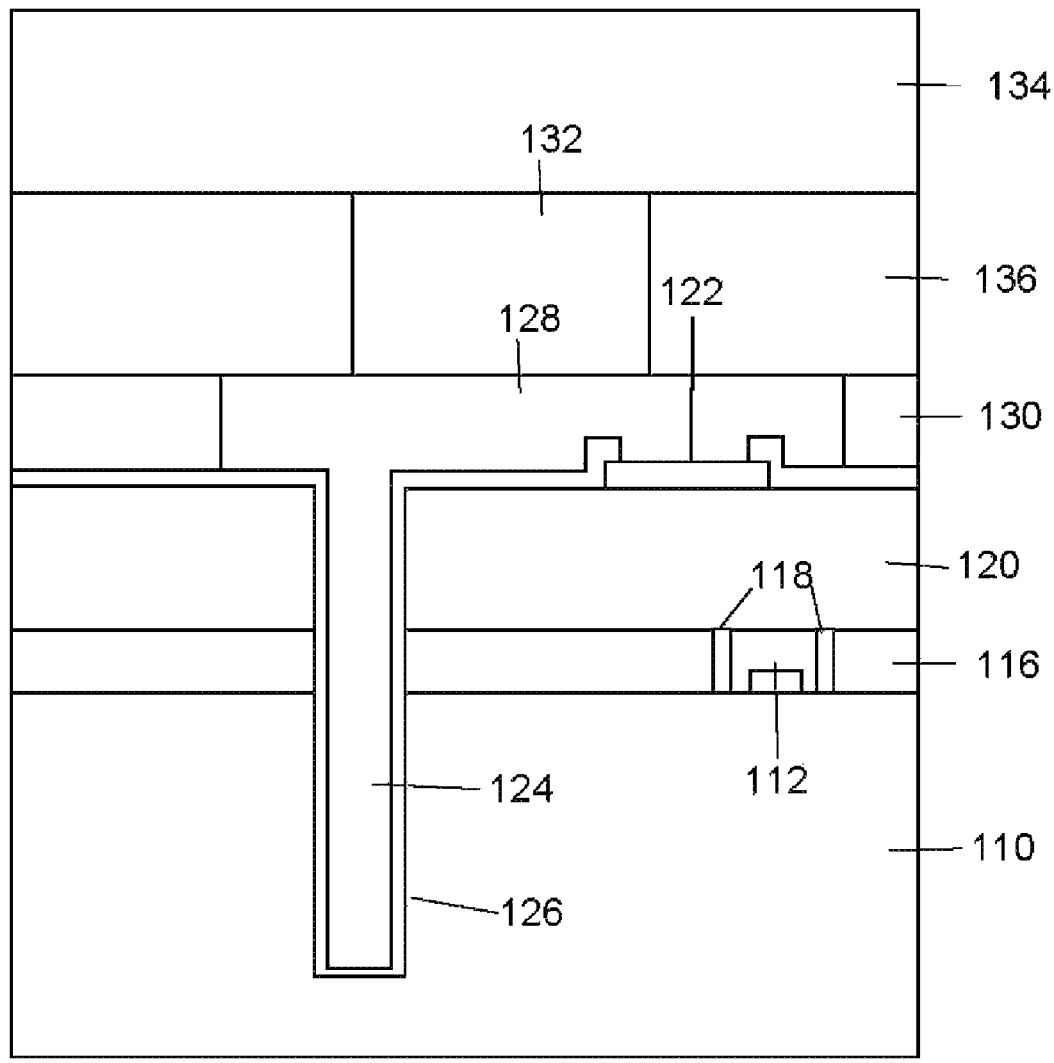
FIGS. 1-4 illustrate intermediate stages in forming a semiconductor device that may be used in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of a method for forming a die having a through-silicon via suitable for use in a three-dimensional integrated circuit (e.g., a stacked die configuration) or a backside bonding configuration are illustrated in FIGS. 1-4. Throughout the various views and illustrative embodiments of the present invention, like reference numerals are used to designate like elements.

Referring first to FIG. 1, a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is an inter-layer dielectric (ILD) layer 116. The ILD layer 116 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 116 may comprise a plurality of dielectric layers.

Contacts 118 are formed through the ILD layer 116 to provide an electrical contact to the electrical circuitry 112. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry to each other and to provide an external electrical connection. The IMD layers 120 are preferably formed of a low-K dielectric material, such as FSG formed by PECVD techniques or high-density plasma CVD (HDPCVD), or the like, and may include intermediate etch stop layers. Contacts 122 are provided in the uppermost IMD layer to provide external electrical connections.

It should also be noted that one or more etch stop layers (not shown) may be positioned between adjacent ones of the dielectric layers, e.g., the ILD layer 116 and the IMD layers 120. Generally, the etch stop layers provide a mechanism to stop an etching process when forming vias and/or contacts. The etch stop layers are preferably formed of a dielectric material having a different etch selectivity from adjacent layers, e.g., the underlying semiconductor substrate 110, the overlying ILD layer 116, and the overlying IMD layers 120. In an embodiment, etch stop layers may be formed of SiN, SiCN, SiCO, CN, combinations thereof, or the like, deposited by CVD or PECVD techniques.

Also shown in FIG. 1 is a through-silicon via 124. The through-silicon via 124 may be formed by any appropriate method. For example, openings may be formed extending into the semiconductor substrate 110 by, for example, one or more etching processes, milling, laser techniques, or the like. The openings are preferably lined with a liner, such as a first liner 126, that acts as an isolation layer. Preferably, the first liner 126 comprises one or more layers of TEOS, but other materials may be used. As will be discussed in greater detail below, portions of the first liner 126 will be removed during subsequent processing steps, so a material that is easy to work with and is easy to remove while causing little or no damage to the other structures should be used.

A protective layer 130, such as a polyimide material, may be formed and patterned over the surface of the first liner 126. Thereafter, the openings may be filled with a conductive material, such as copper, tungsten, aluminum, silver, and combinations thereof, or the like, thereby forming the through-silicon via 124 by, for example, electroplating techniques. Other materials, including conductive diffusion barrier layers, such as TaN, Ta, TiN, Ti, CoW, or the like, may also be used.

Contacts 132, such as metal bumps formed of Cu, W, CuSn, AuSn, InAu, PbSn, or the like, are formed in electrical contact with a conductive line 128, and a carrier substrate 134 is attached using an adhesive 136. Generally, the carrier substrate 134 provides temporary mechanical and structural support during subsequent processing steps. In this manner, damage to the semiconductor substrate 110 is reduced or prevented. The carrier substrate 134 may comprise, for example, glass, silicon oxide, aluminum oxide, and the like. The adhesive 136 may be any suitable adhesive, such as an ultraviolet (UV) glue, which loses its adhesive property when exposed to UV lights.

It should be noted that the material selected for the first liner 126 should be selected such that a high-etch selectivity exists between the material used to form the first liner 126 and the surrounding materials, e.g., the materials of the semiconductor substrate 110, the through-silicon via 124, and any relevant ILD layer 116, IMD layers 120, and/or etch stop layers. As will be discussed in greater detail below, the first liner 126 is removed in subsequent processing steps, and as such, a high-etch rate selectivity allows the removal of the first liner 126 with little or no damage to the surrounding layers.

It should also be noted that the through-silicon via 124 is illustrated as extending into the semiconductor substrate 110 from a top surface of the IMD layers 120 for illustrative purposes only and that other arrangements may be utilized. In another embodiment the through-silicon via 124 may extend from a top surface of the ILD layer 116 or the semiconductor substrate 110. For example, in an embodiment, the through-silicon via 124 is formed by creating openings extending into the semiconductor substrate 110 after forming the contacts 118 by, for example, one or more etching processes, milling, laser techniques, or the like. The openings are also preferably lined with a liner, such as first liner 126, that acts as an isolation layer, and filled with a conductive material as discussed above. The IMD layers 120 may then be formed over the through-silicon via and, optionally, external electrical connections may be created to the through-silicon via using the metallization layers.

The conductive material used to form the through-silicon via 124 is also illustrated as extending over a top dielectric surface, e.g., the IMD layer 120 for illustrative purposes. In this embodiment, the through-silicon via 124 may be formed of a single conductive layer with the conductive line 128, interconnecting the through-silicon via 124 with the contacts 122. In other embodiments, the through-silicon via 124 may not be interconnected with electrical circuitry formed on the semiconductor substrate 110. In this embodiment, the through-silicon via 124 provides an electrical connection to electrical circuitry formed on another substrate (not shown) coupled on either the backside of the substrate or the circuit side of the substrate.

Figure 2:
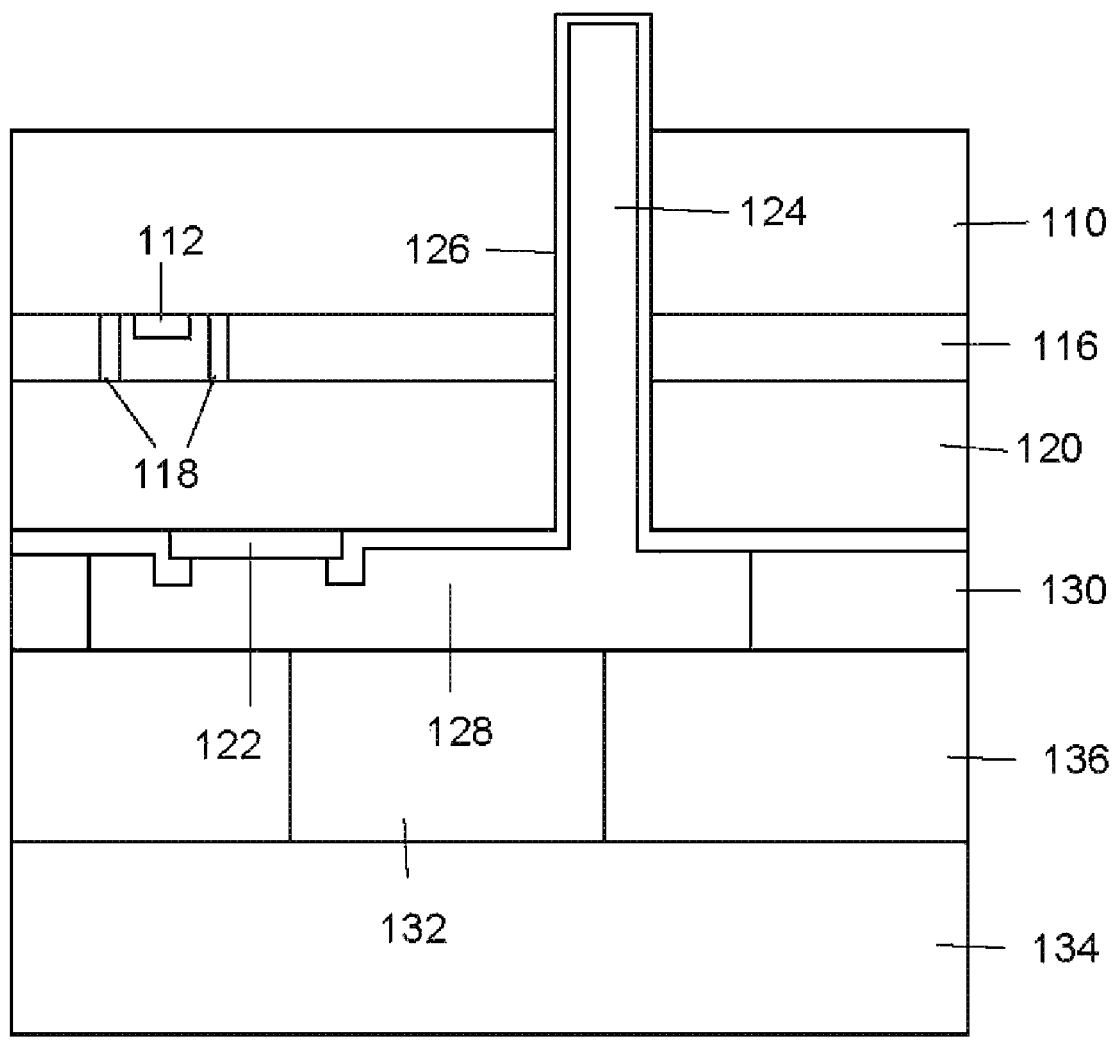

FIG. 2 illustrates a thinning process performed on a backside of the semiconductor substrate 110 to expose the first liner 126 in accordance with an embodiment of the present invention. The thinning process may be performed using an etching process and/or a planarization process, such as a mechanical grinding process or a chemical mechanical polishing (CMP) process. For example, initially a planarizing process, such as grinding or a CMP, may be performed to initially expose the first liner 126. Thereafter, one or more wet etching processes having a high etch-rate selectivity between the material of the first liner 126 and the semiconductor substrate 110 may be performed, thereby leaving the through-silicon via 124 protruding from the backside of the semiconductor substrate 110 as illustrated in FIG. 2. The etch process may be, for example, a dry etch process using $HBr/O_2$, $HBr/Cl_2/O_2$, $SF_6/CL_2$, $SF_6$ plasma, or the like. It should be noted, however, that in other embodiments, the through-silicon via 124 may not protrude from the backside of the semiconductor substrate 110.

Figure 3:
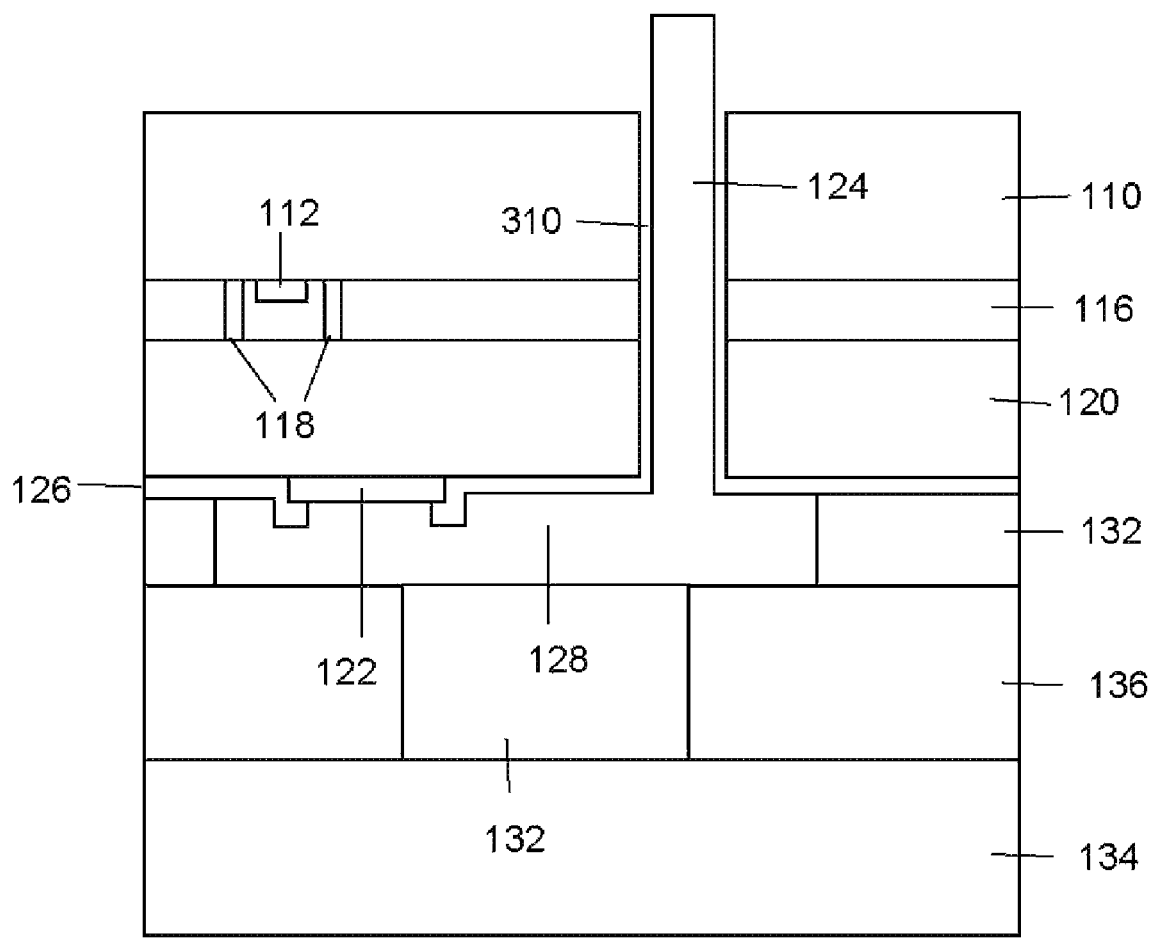

FIG. 3 illustrates an etching process to remove at least a portion of the first liner 126 in accordance with an embodiment of the present invention. One or more wet etching processes having a high etch-rate selectivity between the material of the first liner 126 and the surrounding materials, e.g., the material of the semiconductor substrate 110, the ILD layer 116, the IMD layers 120, the conductive material of the through-silicon via 124, and/or, if present, etch stop layers may be performed. As a result, an air gap 310 surrounding the through-silicon via 124 is formed.

In an embodiment in which the first liner 126 is formed of TEOS, the first liner 126 may be removed by, for example, a dry etch process using $X_2F_2$. A wet etch process may alternatively be used.

FIG. 3 also illustrates the embodiment in which the air gap 310 extends for the entire depth of the through-silicon via 124 and extends over the surface of the IMD layers 120. In this embodiment, the air gap 310 continues over the upper surface of the IMD layers 120 (or the ILD layer 116). Other surfaces, such as the contacts 122, formed of materials having a high etch selectivity with the material of the first liner 126 may cause the etching process to stop. The etching process may also be a timed etch to control the amount of the first liner 126 to be removed.

Figure 4:
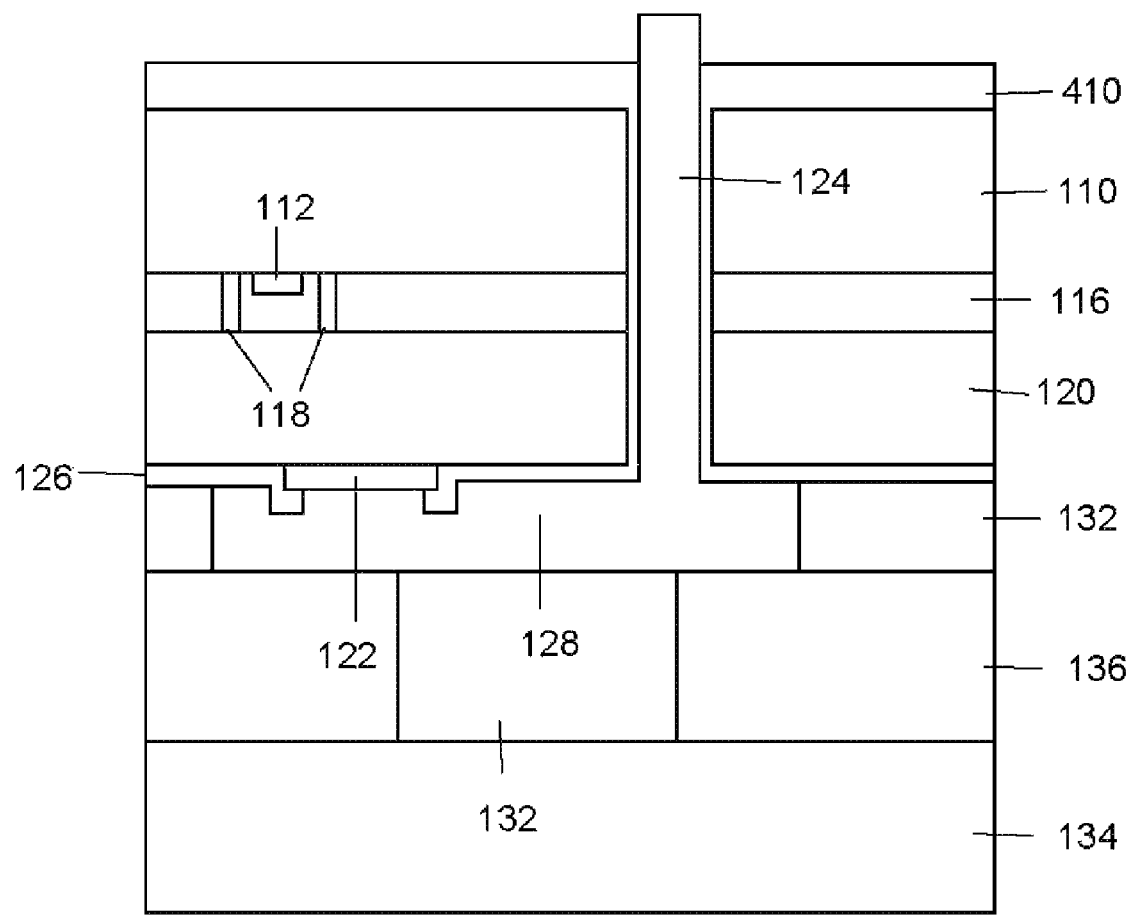

FIG. 4 illustrates a second liner 410 formed over the backside of the semiconductor substrate 110 (or a native oxide that may be formed on the surface of the semiconductor substrate 110) and between the conductive material of the through-silicon via 124 and the surrounding material in accordance with an embodiment of the present invention. The second liner 410 is preferably formed of a low-K or extra low-K (ELK) dielectric material. The second liner 410 may also be formed of polyimide. Generally, low-k dielectric materials have a dielectric constant of less than about 3.5, and ELK dielectric materials have a dielectric constant of less than about 2.8. One of ordinary skill in the art will appreciate that by utilizing a lower dielectric constant material, such as a low-k or ELK dielectric material, as compared to TEOS, the dielectric constant is reduced and, hence, the capacitance is lowered.

Suitable low-k dielectric materials include fluorinated silicate glass (FSG), carbon-containing dielectric materials, and may further contain nitrogen, hydrogen, oxygen, and combinations thereof. The second liner 410 may be formed by, for example, a spin coating process. After forming the second liner 410, a curing step may be performed. For example, low-k and ELK dielectric materials may be cured using a ultra-violet (UV) curing process with a UV light. Other methods of curing may be used.

As illustrated in FIG. 4, the material used to form the second liner 410 extends over the backside of the semiconductor substrate 110, thereby providing an insulating layer between the protruding portions of the through-silicon via 124 and the semiconductor substrate 110. It should be noted that in an embodiment in which it is desirable that the through-silicon via 124 protrude from an upper surface of the second liner 410, it may be necessary to perform another etch process. In particular, if the second liner 410 is formed using a process that forms a conformal layer, the second liner 410 may extend over the protruding portions of the through-silicon via 124. In this case, a mask may be deposited and patterned to expose the second liner 410 positioned over the protruding portions of the through-silicon via 124 and an etch process may be performed to remove the exposed portions of the second liner 410, thereby exposing the through-silicon via 124. Such a process may not be necessary if a self-planarizing process, such as a spin-on process, is utilized to form the second liner 410.

Thereafter, other back-end-of-line (BEOL) processing techniques suitable for the particular application may be performed to complete the semiconductor device. For example, the carrier substrate 134 may be removed, under-bump metallization and contacts may be formed on the circuit side and the backside of the substrate, an encapsulant may be formed, a singulation process may be performed to singulate individual dies, wafer-level or die-level stacking, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

One of ordinary skill in the art will appreciate that the process discussed above provides a low-k or extra low-k dielectric liner to be utilized without the added concerns of damaging the low-k dielectric during other processes. For example, because the second liner is formed later in the fabrication process, the second liner will not be damaged during, for example, dry etching processes, wet etching processes, CMP, or the like.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    providing a substrate, the substrate having a first side and a second side opposite the first side;
    forming an opening extending from the first side of the substrate into the substrate;
    forming a first liner along sidewalls of the opening;
    forming a conductive material over the first liner in the opening;
    thinning the second side of the substrate, thereby exposing at least a portion of the first liner;
    removing at least a portion of the first liner interposed between the conductive material and the substrate and removing at least a portion of the first liner extending over a dielectric layer on the first side of the substrate; and
    forming, after the removing, a second liner interposed between the conductive material and the substrate and extending over at least a portion of the dielectric layer formed on the first side of the substrate.

2. The method of claim 1, wherein the second liner comprises a material having a dielectric constant less than about 3.5.

3. The method of claim 1, wherein the first liner comprises a material having a dielectric constant greater than about 3.5.

4. The method of claim 1, wherein the second liner comprises polyimide.

5. The method of claim 1, wherein the thinning the second side of the substrate includes etching the second side of the substrate such that a portion of the conductive material protrudes from the second side of the substrate.

* * * * *